United States Patent
Sturm

(10) Patent No.: US 7,082,173 B1
(45) Date of Patent: Jul. 25, 2006

(54) SOFT DECISION DECODING OF A SCHEDULED CONVOLUTIONAL CODE

(75) Inventor: Thomas Sturm, Munich (DE)

(73) Assignee: Siemens Aktiengellschaft, Munich (DE)

( * ) Notice: Subject to any disclaimer, the term of this patent is extended or adjusted under 35 U.S.C. 154(b) by 0 days.

(21) Appl. No.: 09/856,936

(22) PCT Filed: Dec. 1, 1999

(86) PCT No.: PCT/DE99/03824

§ 371 (c)(1),
(2), (4) Date: May 30, 2001

(87) PCT Pub. No.: WO00/33467

PCT Pub. Date: Jun. 8, 2000

(30) Foreign Application Priority Data

Dec. 1, 1998 (DE) ................................. 198 55 453

(51) Int. Cl.
*H03M 13/03* (2006.01)

(52) U.S. Cl. ........................ 375/341; 714/792; 714/794
(58) Field of Classification Search ................ 375/340, 375/341; 714/786, 792, 794, 795
See application file for complete search history.

(56) References Cited

U.S. PATENT DOCUMENTS

| 5,566,191 A |   | 10/1996 | Ohnishi et al. |
| 5,574,751 A |   | 11/1996 | Trelewicz |
| 5,721,746 A |   | 2/1998  | Hladik et al. |
| 5,936,605 A | * | 8/1999  | Munjal ...................... 345/102 |

FOREIGN PATENT DOCUMENTS

| DE | 40 38 251 A1 | 6/1992 |
| DE | 44 37 984 A1 | 8/1996 |
| EP | 0 391 354 A2 | 10/1990 |

OTHER PUBLICATIONS

Joeressen, Olaf J, et al., "High-Speed VLSI Architectures for Soft-Output Viterbi Decoding", 8367 Journal of VLSI Signal Processing (1994), No. 2, Dordrecht, NL, pp. 169-180.

* cited by examiner

*Primary Examiner*—Jay K. Patel
*Assistant Examiner*—David B. Lugo
(74) *Attorney, Agent, or Firm*—Morrison & Foerster LLP

(57) ABSTRACT

A method for decoding a predetermined code word is specified in which the code word comprises a number of positions having different values. In this method, encoding is performed, in particular, by way of a terminated convolutional code. Each position of the code word is correlated with a safety measure (soft output) for a most probable Boolean value by performing the correlation on the basis of a trellis representation. The decoding of the code word is determined by the correlation of the individual positions of the code word.

5 Claims, 4 Drawing Sheets

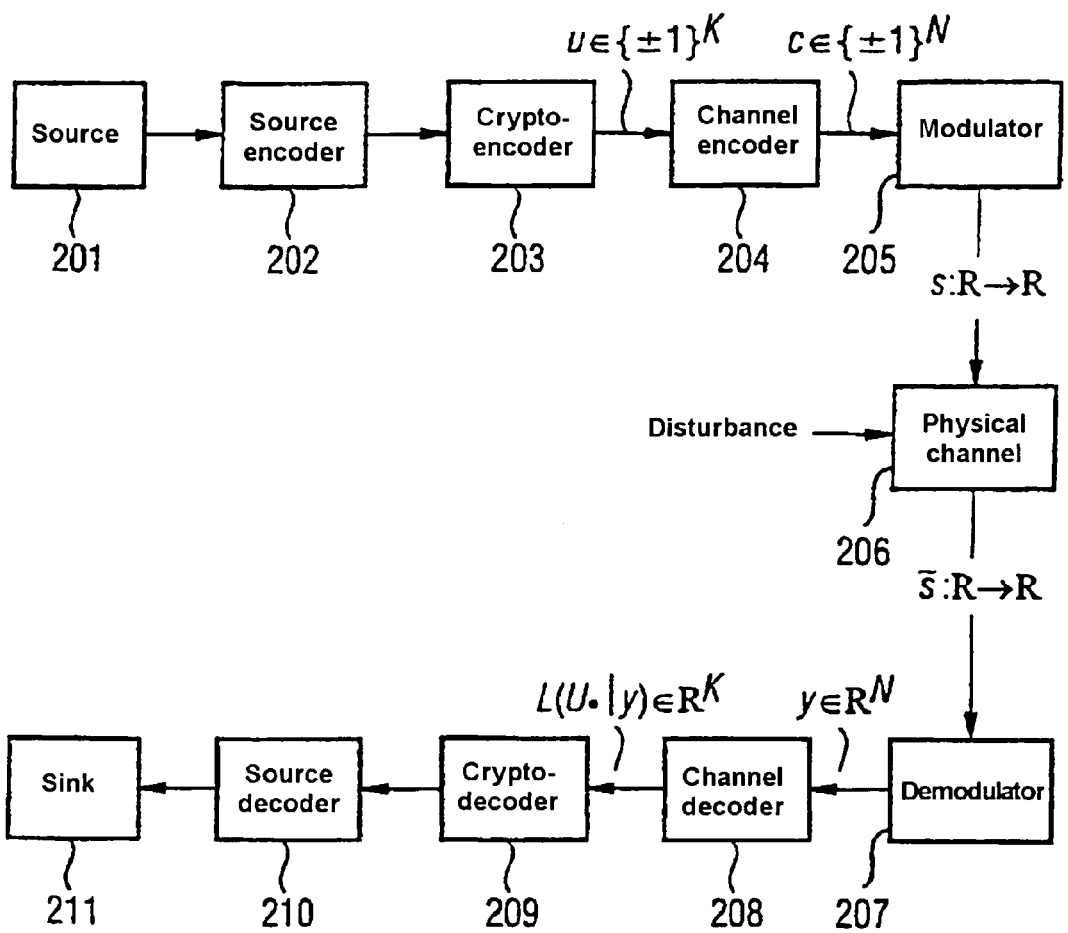

FIG 3

```
for s∈S:                                                    Pre-allocation
    A(s,0) := 0; B(s,0) := 0;

A(s,0) := 1; B(s₀,0) := 1;                                  Starting state
                                                            Termination
for q = 1,...,k:                                            Consideration of all states
    für s∈S:                                                Follow-up state
        s⁺ := T(s,v0);                                      Calculation of B
        B(s,q) := μ(s,Q-(q-1))B(s⁺,q-1);

for q = 1,...,a-1:                                          Progression in the trellis diagram
    für s∈S:                                                Consideration of all states
        A(s,q) := A(T̂(v₀,s),q-1);                          Pre-allocation of A
        B(s,k+q) := B(T(s,v₀),k-1+q);                       Pre-allocation of B
        für v ∈ V \ {v₀}                                    Consideration of all transitions
            A(s,q) := A(s,q)+A(T̂(v,s),q-1);                Calculation of A
            B(s,k+q) := B(s,k+q)+B(T(s,v₀),k-1+q);          Calculation of B A(s,q) := μ(s,q)·A(s,q);                            Calculation of A
        B(s,k+q) := μ(s,a-q)·B(s,k+q);                      Calculation of B for i = 1,...,K:                                            Progression in the trellis diagram
    A^i_{+1} := 0; A^i_{-1} := 0;                           Pre-allocation
    j = 1+[(i-1)/b];
    for s∈S:                                                Consideration of all states
        for v ∈ V^i_j(+1):                                  Transitions
            A^i_{+1} := A^i_{+1} +A(s,j-1)·B(T(s,v),Q-j+1); Update of A^i +1 for v ∈ V^i_j(-1):                                  Transitions
            A^i_{-1} := A^i_{-1} +A(s,j-1)·B(T(s,v),Q-j+1); Update of A^i +1

L(U_i|y) := ln(A^i_{+1}/A^i_{-1});                      i-th soft output
```

FIG 4

| | |
|---|---|
| for $s \in S$: | Pre-allocation |
| $\quad A(s,0) := 0; B(s,0) := 0;$ | |
| $A(s_0,0) := 1; B(s_0,0) := 1;$ | Starting state |
| for $q = 1,...,k$: | Termination |
| $\quad$ for $s \in S$: | Consideration of all states |
| $\quad\quad s^+ := T(s,+1);$ | Follow-up state |
| $\quad\quad B(s,q) := \mu(s,Q-(q-1))B(s^+,q-1);$ | Calculation of B |
| | |
| for $q = 1,...,a-1$: | Progression in the trellis diagram |
| $\quad$ for $s \in S$: | Consideration of all states |
| $\quad\quad t^+ := \hat{T}(+1,s); t^- := \hat{T}(-1,s);$ | Predecessor states |
| $\quad\quad s^+ := T(s,+1); s^- := T(s,-1);$ | Follow-up states |
| $\quad\quad A(s,q) := \mu(s,q) \cdot (A(t^+,q-1) + A(t^-,q-1));$ | Calculation of A |
| $\quad\quad B(s,k+q) := \mu(s,a-q) \cdot (B(s^+,k-1+q) + B(s^-,k-1+q));$ | Calculation of B |
| | |
| for $i = 1,...,a$: | Progression in the trellis diagram |
| $\quad A^i_{+1} := 0; A^i_{-1} := 0;$ | Pre-allocation |
| $\quad$ for $s \in S$: | Consideration of all states |
| $\quad\quad s^+ := T(s,+1); s^- := T(s,-1);$ | Follow-up states |
| $\quad\quad A^i_{+1} := A^i_{+1} + A(s,i-1) \cdot B(s^+, Q-i+1);$ | Update of $A^i + 1$ |
| $\quad\quad A^i_{-1} := A^i_{-1} + A(s,i-1) \cdot B(s^-, Q-i+1);$ | Update of $A^i + 1$ |
| $\quad L(U_i|y) := \ln(A^i_{+1}/A^i_{-1});$ | i-th soft output |

SOFT DECISION DECODING OF A SCHEDULED CONVOLUTIONAL CODE

BACKGROUND OF THE INVENTION

1. Field of the Invention

The invention relates to a method and an arrangement for decoding a predetermined code word.

2. Description of the Related Art

In the decoding of a code word which has a predetermined number of positions, the information-carrying positions are restored as completely as possible.

The decoding takes place at the end of the receiver which has received the code word via a disturbed channel. Signals are transmitted, in particular as Boolean values, preferably subdivided into +1 and −1, via the channel where they are subject to a disturbance, and are converted into analog values which can deviate to a greater or lesser extent from the predetermined Boolean values (±1) by a demodulator.

The general assumption is K positions of binary information ("information bits") without redundancy $u \in \{\pm 1\}^K$, which is mapped into a code word $c \in \{\pm 1\}^N$ by means of systematic block codes or unsystematic block codes by a channel coder. In this arrangement, the code word contains N−K bits (also "check bits") which can be used as redundant information to the N information bits for restoring the information after transmission via the disturbed channel.

The systematic block code adds to the N information bits N−K check bits which are calculated from the information bits, the information bits themselves remaining unchanged whereas, in the unsystematic block code, the information bits themselves are changed, for example the information is in an operation performed from one to the next position. Here, too, check bits are provided for reconstructing the information hidden in the operations. In the text which follows, in particular, a technically significant variant of unsystematic block codes, the so-called terminated convolutional codes, is considered.

"Hard" decoding of a correlation of the received code word (with the positions occupied by analog values) i.e., correlating each position with the nearest Boolean value in each case, is a decisive disadvantage since valuable information is lost in this process.

SUMMARY OF THE INVENTION

It is the object of the invention to determine a decoding of a predetermined code word, with decoding supplying analog values (so-called "soft outputs") which, in particular, can be taken into consideration in the subsequent decoding method and thus provide for high error correction in the transmission of code words via a disturbed channel.

This object is achieved in accordance with the various embodiments of the method and apparatus discussed below.

To achieve this object, a method for decoding a predetermined code word is specified in which the code word comprises a number of positions having different values. In this arrangement, encoding has taken place, in particular, by way of a terminated convolutional code. Each position of the code word is correlated with a safety measure (soft output) for a most probable Boolean value by performing the correlation on the basis of a trellis representation. The decoding of the code word is determined by the correlation of the individual positions of the code word.

A decisive advantage here is that due to the correlation based on the trellis representation, a distinct reduction in complexity compared with a general representation takes place with the result that decoding of the code word (generation of the soft outputs at the positions of the code word) also becomes possible in real time.

A further development consists in that the decoding rule for each position of the code word is determined by $$L(U_i|y) = \ln \left( \frac{\sum_{c \in \Gamma^i(+1)} \exp\left(-\frac{(y-c)^T(y-c)}{2\sigma^2}\right)}{\sum_{c \in \Gamma^i(-1)} \exp\left(-\frac{(y-c)^T(y-c)}{2\sigma^2}\right)} \right), \quad (1)$$

where $L(U_i|y)$ is a safety measure (soft output) for the i-th position of the code word to be determined;

y is a demodulation result to be decoded;

c is a code word;

$\Gamma^i(\pm 1)$ are all code words for $u_i = \pm 1$; and $\sigma^2$ is a variance (channel disturbance).

Another further development provides that the equation (1) is solved by utilizing a characteristic of a convolutional code used in the coding (and correspondingly in the decoding) which determines states in accordance with a shift register operation used during the convolution, from which states, in turn, the trellis representation is obtained.

In an additional further development, the trellis representation is run through in a predetermined direction in order to recursively calculate terms $A_m$ and $\tilde{A}_m$ respectively. Into this calculation rule, node weights $\mu_m(s)$ which are determined by the demodulation result y enter at the nodes (s, m) of the trellis representation. The terms $A_m$ and $\tilde{A}_m$ are described by $$\tilde{A}_m(E) = \sum_{s \in E} A_m(s), \text{ for } m \in \mathbb{N} \quad (2)$$

with $$A_m(s) = \mu_m(s) \sum_{t \in W(s, V_m)} A_{m-1}(t), \text{ for } m \in \mathbb{N} \quad (3)$$

and a starting value $$A_0(s) = \begin{cases} 1 : \text{for } s = s_0, \\ 0 : \text{else} \end{cases} \quad (4)$$

A more detailed discussion of the forms of description listed here can also be found in the description of the exemplary embodiment.

One embodiment provides that mappings $B_m$ are determined by way of the trellis representation, the trellis representation being processed in opposition to the predetermined direction. The term $B_m$ is determined by $$B_m(s) = \mu_{Q-m+1}(s) \sum_{t \in T(s, V_{Q-m+2})} B_{m-1}(t), \text{ for } 1 \leq m \leq Q, \quad (5)$$

where $$B_0(s) = \begin{cases} 1 : \text{for } s = s_0, \\ 0 : \text{else} \end{cases} \quad (6)$$

is determined for terminating the recursion.

Furthermore, terms $A_\alpha^i$ can be determined by again running through the trellis representation taking into consideration the terms $A_m$ and $B_m$ already determined. In particular, the terms $A_\alpha^i$ are determined in accordance with $$A_\alpha^i(y) = \sum_{s \in S} A_{j-1}(s) \sum_{t \in T(s,V_j^i(\alpha))} B_{Q-j+1}(t). \quad (7)$$

In a further embodiment, the K positions of the decoded code word are determined in accordance with $$L(U_i \mid y) = \ln\left(\frac{A_{+1}^z(y)}{A_{-1}^z(y)}\right), i = 1, \ldots, K. \quad (8)$$

In particular, an AWGN (Additive Gaussian White Noise) channel model is used for the derivation. The method presented can also be used for other channel models, especially for channel models used in mobile radio.

Another embodiment relates to the use of the method in a mobile radio network, especially the GSM network.

It is also a further development that, after the soft outputs have been determined, there is a "hard" correlation of the analogue values with the Boolean values ±1. In this arrangement, the nearest Boolean value is in each case determined for correlating the analogue value.

The soft output values determined can be used as input values for further decoding when concatenated codes are used.

To achieve the object, an arrangement for decoding a predetermined code word is also specified in which a processor unit is provided which is set up in such a manner that 1. the code word comprises a number of positions having different values;
2. each position of the code word can be correlated with a soft output value by performing the correlation on the basis of a trellis representation; and
3. the decoding of the code word can be determined by the correlation of the individual positions of the code word.

This arrangement is particularly suitable for performing the method according to the invention or one of its further developments explained above.

BRIEF DESCRIPTION OF THE DRAWINGS

In the text which follows, exemplary embodiments of the invention will be shown and explained with reference to the drawings, in which:

FIG. 1 is a block diagram showing a representation of digital information transmission;

FIG. 2 is an algorithm in pseudocode notation for progressing in the trellis diagram observing all states for the calculation of node weights;

FIG. 3 is an algorithm in pseudocode notation for determining soft outputs (general case);

FIG. 4 is an algorithm in pseudocode notation for determining soft outputs (special case: binary state transition)

DETAILED DESCRIPTION OF THE INVENTION

Figure 5:
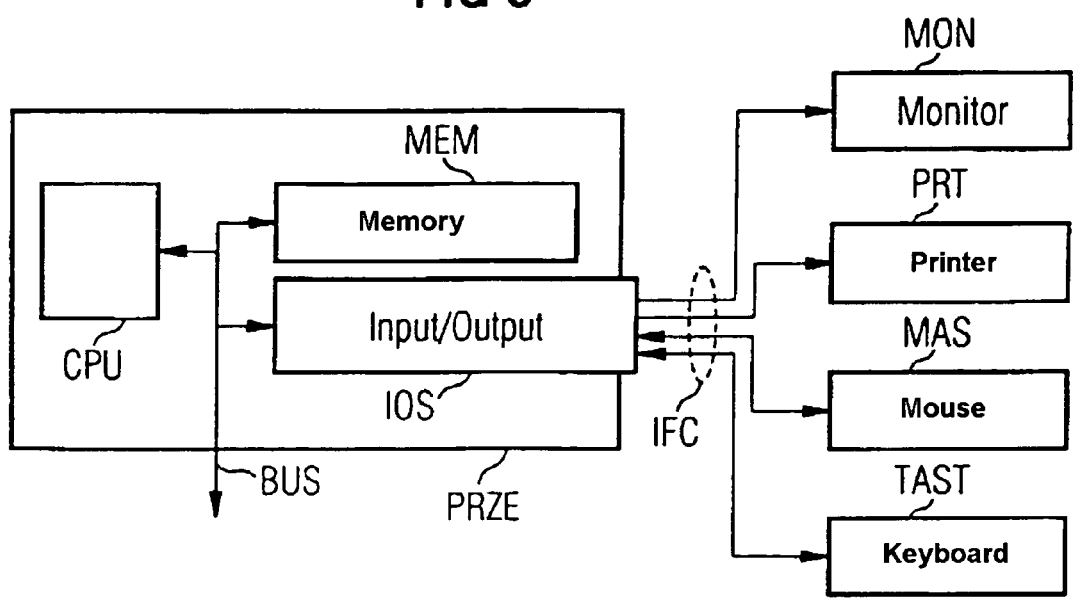
FIG. 5 is a block diagram of a processor unit.

The text which follows describes in greater detail, first the convolutional code, then the reduction in complexity in the calculation of soft outputs and, finally, an algorithmic translation of the reduction in complexity.

Terminated Convolutional Code

In communication technology, terminated convolutional codes are mostly used in concatenation with other systematic or unsystematic block codes. In particular, the decoding result of a convolutional decoder is used as the input for another decoder.

To ensure the lowest possible error rate, it is necessary to supply "soft" decoding decisions instead of "hard" ones in the convolutional decoding for the further decoder, i.e., to generate a tuple of "soft" values (soft outputs) from R instead of a tuple of "hard" Boolean (±1) values. The absolute value of the respective "soft" decision then provides a safety measure for the correctness of the decision.

In principle, these soft outputs can be calculated in accordance with equation (1), depending on the channel model. However, the numeric complexity for calculating a soft output is $O(2^K)$, where K specifies the number of information bits. If K is realistically large, then these formulae can not be evaluated, in particular, since such a code word must be calculated again every few milliseconds (a real-time requirement).

One consequence of this is that soft outputs are dispensed with (with all consequences for the word and bit error rates) or, respectively, fewer elaborate approximations are performed for determining the soft outputs.

In the text which follows, a possibility for terminated convolutional codes is specified with the aid of which this complexity can be reduced to O(K) in a trellis representation for calculating all soft outputs, i.e., this solution provides the possibility for a precise evaluation of equation (1).

In the text which follows, the bits of the code are represented in {±1} representation. In comparison with a {0, 1} representation, which is often used in information technology, −1 corresponds to 1 and 1 corresponds to 0.

On a body {±1}, addition ⊕ and multiplication ⊙ are defined as follows:

| | |
|---|---|
| −1 ⊕ −1 = 1 | −1 ⊙ −1 = −1 |
| −1 ⊕ 1 = −1 | −1 ⊙ 1 = 1 |
| 1 ⊕ −1 = −1 | 1 ⊙ −1 = 1 |
| 1 ⊕ 1 = 1 | 1 ⊙ 1 = 1 |

The coding is done with the aid of a "shift register" into which bit blocks (input blocks) of the information bits are written with each clock pulse. The combination of the bits of the shift register then generates one bit block of the code word. The shift register is pre-assigned +1 bits in each case. To terminate the coding (termination) blocks of tail zeros (+1) are shifted in afterwards. As has been mentioned initially, check bits by way of which bit errors can be corrected are correlated with the information bits by way of coding.

The following are defined for the further embodiments:
b∈N number of input bits per block;
$V:=\{\pm 1\}^b$ set of state transition signs;
a∈N number of input blocks;
K:=a·b number of information bits without tail zeros;
k∈N, k≧2 block length of the shift register, penetration depth;
L:=k·b bit length of the shift register;
$S:=\{\pm 1\}^L$ set of shift register signs;
n∈N number of output bits per block;
Q:=a+k−1 number of state transitions, input blocks+ zeros;
N:=n·Q number of code bits; and $$R := \frac{b}{n} \text{ code rate.} $$

It should be noted here that the code rate is not K/N since the information bits have been counted without the zeros (+1) of the convolutional termination.

Furthermore, $s_0 \in S$ and $v_0 \in V$ are assumed to be the respective zero elements, i.e., $$s_0 = (+1, \ldots, +1)^\tau, v_0 = (+1, \ldots, +1)^\tau. \tag{9}$$

The state transition function of the shift register is assumed to be $$T: S \times V \rightarrow S, \tag{10}$$

$$(s,v) \mapsto (s^{b+1}, \ldots, s^L, v^1, \ldots, v^b)^\tau. \tag{11}$$

The terminated convolutional code is defined by the characterizing subsets $$M_1, \ldots, M_n \subseteq \{1, \ldots, L\}, \tag{12}$$

(combination of register bits, alternatively in polynomial representation).

The current register content is coded via $$C: S \rightarrow \{\pm 1\}^n, \tag{13}$$

$$s \mapsto C(s) \text{ where } C_j(s) := \bigoplus_{i \in M_j} s^i, \text{ for } 1 \le j \le n. \tag{14}$$

where $s^i$ is the i-th component of s.

Finally, the coding of an information word is defined by way of $$\phi: \{\pm 1\}^K \rightarrow \{\pm 1\}^N, \tag{15}$$

$$u \mapsto \begin{pmatrix} C(s_1) \\ \vdots \\ (s_Q) \end{pmatrix}, \tag{16}$$

where $s_0 \in S$ is the zero state (zero element), $$u = \begin{pmatrix} v_1 \\ \vdots \\ v_a \end{pmatrix}, v_i \in V, 1 \le i \le a, \tag{17}$$

$$v_i := v_0, a+1 \le i \le Q, \tag{18}$$

and furthermore $$s_i := T(s_{i-1}, v_i), 1 \le i \le Q. \tag{19}$$

According to the definition of T, the following is obtained $$s_{Q+1} := T(s_Q, v_0) = s_0. \tag{20}$$

Accordingly, the set of all code words is $$\phi(\{\pm 1\}^K) := \{\phi(u) \in \{\pm 1\}^N; u \in \{\pm 1\}^K\}. \tag{21}$$

Often, polynomials $$p_j \in \{0,1\}[D] \text{ where } deg(p_j) \le L-1$$

are used instead of the sets $M_j$ for code definition, i.e., $$p_j(D) = \sum_{i=0}^{L-1} \gamma_{i,j} D^i, \tag{22}$$

with $$\gamma_{i,j} \in \{0,1\} \ i=0, \ldots, L-1, j=1, \ldots, n.$$

The following transformations then apply for j=1, ..., n:

$$M_j = \{i \in \{1, \ldots, L\}; \gamma_{L-i,j} = 1\} \tag{23}$$

$$p_j(D) = \sum_{i \in M_j} D^{L-i}. \tag{24}$$

Block Code Representation

Since a terminated convolutional code is a block code, the code bits $c_j$, $1 \le j \le N$ can also be represented from the information bits $u_i$, $1 \le i \le K$, with index sets $J_j$, as follows:

$$c_j := \bigoplus_{i \in J_j} u_i, \text{ for } 1 \le j \le N, \tag{25}$$

where $$J_1, \ldots, J_N \subseteq \{1, \ldots, K\}. \tag{26}$$

The index sets $J_j$ can be calculated directly from the above index sets $M_m$ of the code definition.

Consider $$j = n(q-1) + m, q=1, \ldots, Q, m=1, \ldots, n. \tag{27}$$

$$c_j = C_m(s_q) = \bigoplus_{i \in M_m} (s_q)^i = \bigoplus_{i \in M_m} u_{i+b(q-k)}, \tag{28}$$

where $u_i := +1$ for $i \notin \{1, \ldots, K\}$.

Furthermore, $$c_j = \bigoplus_{i - b(q-k) \in M_m} u_i = \bigoplus_{i \in M_m + b(q-k)} u_i, \tag{29}$$

and it thus follows for j=1, ..., N that $$J_j = \{1, \ldots, K\} \cap (M_m + b(q-k)) \tag{30}$$

$$= \{i \in \{1, \ldots, K\}; i - b(q - k) \in M_m\}.$$

Example: SACCH Convolutional Code

In the above terminology, the convolutional code described in section 4.1.3 of the GSM Technical Specification GSM 05.03, Version 5.2.0 (channel coding) is:
b=1 number of input bits per block;
V={±1} set of state transition signs;
a=224 number of input blocks;
K=224 number of information bits without tail zeros;
k=5 block length of the shift register, depth of penetration;
L=5 bit length of the shift register;
S={±1}$^5$ set of shift register signs;
n=2 number of output bits per block;
Q=228 number of state transitions, input blocks+zeros;
N=456 number of code bits;

$$R = \frac{1}{2} \text{ code rate;}$$

$M_1$={1,2,5} characterizing set; polynomial: $1+D^3+D^4$; and
$M_2$={1,2,4,5} characterizing set; polynomial: $1+D+D^3+D^4$.

Soft Outputs in an AWGN Channel Model

In the text which follows, calculation rules for determining the soft outputs are derived, especially for the sake of clarity.

For this purpose, a probability space $(\Omega, S, P)$ and a K-dimensional random variable $U:\Omega \rightarrow \{\pm 1\}^K$ are considered which have the properties The components $U_1, \ldots, U_K: \Omega \rightarrow \{\pm 1\}$ are stochastically independent.

The following holds for i=1, ..., K $$P(\{\omega \in \Omega; U_i(\omega) = -1\}) = P(\{\omega \in \Omega; U_i(\omega) = +1\}). \quad (31)$$

FIG. 1 shows a representation of digital telecommunication. A unit consisting of source 201, source encoder 202 and crypto-encoder 203 determines an information item $u \in \{\pm 1\}^K$ which is used as input for one (or possibly more) channel encoder(s) 204. The channel encoder 204 generates a code word $c \in \{\pm 1\}^N$ which is fed into a modulator 205 and is transmitted via a disturbed physical channel 206 to a receiver where it is determined to become a real-value code word $y \in R^N$ in a demodulator 207. This code word is converted into a real-value information item in a channel decoder 208. If necessary, a "hard" correlation with the Boolean values ±1 can also be made in a further decoder so that the received information is present in Boolean notation. The receiver is completed by a unit of crypto-decoder 209, source decoder 210 and sink 211. The two crypto-encoder 203 and crypto-decoder 209 units are optional in this arrangement.

The information to be reconstructed, $u \in \{\pm 1\}^K$, of the crypto-encoder 203 is interpreted as implementation of the random variables U since nothing is known about the choice of u in the receiver.

Thus, the output $c \in \{\pm 1\}^N$ of the channel encoder 204 is an implementation of the random variables $\phi(U)$.

The output $y \in R^N$ of the demodulator 207 is interpreted as implementation of the random variables $$Y:\Omega \rightarrow R^N, \quad (32)$$

$$\omega \mapsto \phi(U(\omega)) + Z(\omega), \quad (33)$$

a random variable $Z:\Omega \rightarrow R^N$ representing the channel disturbances in the physical channel 206.

In the text which follows, an AWGN channel model is assumed, i.e., Z is a $N(0, \sigma^2 I_N)$ normally distributed random variable which is stochastically independent of U and, respectively, $\phi(U)$. The variance $\sigma^2$ is calculated from the ratio between noise power density and mean energy in the channel 206 and is here assumed to be known.

The unknown output $u \in \{\pm 1\}^K$ of the crypto-encoder is to be reconstructed on the basis of an implementation y of Y. To estimate the unknown quantities $u_1, \ldots, u_K$, the distribution of the random variables U is investigated given the condition that y has been received.

The consequence of the fact that the random variable Y is a steady random variable is that the consideration of U under the condition that y has been received ($Y(\hat{\omega})=y$) is extremely complicated.

Firstly, the following is defined for $i \in \{1, \ldots, K\}$ and $\alpha \in \{\pm 1\}$ $$\Gamma^i(\alpha) := \{\phi(u); u \in \{\pm 1\}^K; u_i = \alpha\}. \quad (34)$$

In a preparatory step, the following quantities are considered for $\epsilon > 0$, paying attention to the injectivity of the coding map $\phi$:

$$L_\epsilon(U_i|y) := \ln\left(\frac{P(\{\omega \in \Omega; U_i(\omega) = +1\}|\{\omega \in \Omega; Y(\omega) \in M_{y,\epsilon}\})}{P(\{\omega \in \Omega; U_i(\omega) = -1\}|\{\omega \in \Omega; Y(\omega) \in M_{y,\epsilon}\})}\right) \quad (35)$$

$$= \ln\left(\frac{\sum_{c \in \Gamma^i(+1)} P(\{\omega \in \Omega; \varphi(U(\omega)) = c\}|\{\omega \in \Omega; Y(\omega) \in M_{y,\epsilon}\})}{\sum_{c \in \Gamma^i(-1)} P(\{\omega \in \Omega; \varphi(U(\omega)) = c\}|\{\omega \in \Omega; Y(\omega) \in M_{y,\epsilon}\})}\right),$$

for i=1, ..., K, where $M_{y,\epsilon}:=[y_1, y_1+\epsilon] \times \ldots \times [y_N, y_N+\epsilon]$.

Using the theorem by Bayes, the following is obtained:

$$L_\epsilon(U_i|y) = \ln\left(\frac{\sum_{c \in \Gamma^i(+1)} P(\{\omega \in \Omega; Y(\omega) \in M_{y,\epsilon}\}|\{\omega \in \Omega; \varphi(U(\omega)) = c\})}{\sum_{c \in \Gamma^i(-1)} P(\{\omega \in \Omega; Y(\omega) \in M_{y,\epsilon}\}|\{\omega \in \Omega; \varphi(U(\omega)) = c\})}\right) \quad (36)$$

$$= \ln\left(\frac{\sum_{c \in \Gamma^i(+1)} \int_{M_{y,\epsilon}} \exp\left(-\frac{(x-c)^T(x-c)}{2\sigma^2}\right) dx}{\sum_{c \in \Gamma^i(-1)} \int_{M_{y,\epsilon}} \exp\left(-\frac{(x-c)^T(x-c)}{2\sigma^2}\right) dx}\right).$$

Considering then the limiting process of $L_\epsilon(U_i|y)$ for $\epsilon \downarrow 0$ by using L'Hospital's rule several times, the soft output $L(U_i|y)$ is obtained for each symbol as in equation (1).

Since $$\Gamma^i(+1) \cup \Gamma^i(-1) = \{\pm 1\}^K$$

holds true, a total of $O(2^K)$ numeric operations are necessary for evaluating equation (1).

The vector $L(U.|y) \epsilon R^K$ is the result of decoder 208.

Reduction of Complexity in the Determination of the Soft Outputs

Soft-Output Determination for Convolutional Codes

Firstly, the special characteristics of the terminated convolutional coding are used for providing an organized representation of the soft-output formula (1).

For an arbitrary, but preselected output $y \epsilon R^N$ of the demodulator 207, the following weighting function (a Viterbi metric) of code words is considered:

$$F: \{\pm 1\}^N \to \mathbf{R}_0^+, \qquad (37)$$

$$c \mapsto \sum_{j=1}^{N} (y_j - c_j)^2. \qquad (38)$$

For permissible code words $c \epsilon \{\pm 1\}^N$, i.e. $c \epsilon \phi(\{\pm 1\}^K)$, F(c) can be reduced as follows, using the shift register representation:

$$F(c) = \sum_{q=1}^{Q} \underbrace{\sum_{j=1}^{n} (y_{n(q-1)+j} - C_j(\tilde{s}_q^c))^2}_{=:\Delta F_q(\tilde{s}_q^c)}, \qquad (39)$$

where $\tilde{s}_q^c$ stands for the q-th state of the shift register in the (unambiguous) generation of the word c.

Then the following is defined for $I=1, \ldots, K$ and $\alpha \epsilon \{\pm 1\}$:

$$A_\alpha^i(y) := \qquad (40)$$

$$\sum_{c \epsilon \Gamma^i(\alpha)} \exp\left(-\frac{(y-c)^T(y-c)}{2\sigma^2}\right) = \sum_{c \epsilon \Gamma^i(\alpha)} \prod_{q=1}^{Q} \exp\left(-\frac{1}{2\sigma^2} \Delta F_q(\tilde{s}_q^c)\right).$$

Thus, the following holds true for the soft outputs $$L(U_i|y) = \ln\left(\frac{A_{+1}^i(y)}{A_{-1}^i(y)}\right), i = 1, \ldots, K. \qquad (41)$$

In the text which follows, the values $A_\alpha^i(y)$ are determined with the aid of a trellis diagram/representation.

To reduce the complexity of calculation, the following procedure is adopted in the following sections:
  generalization of $A_\alpha^i$ by mappings $\tilde{A}_m$.
  Recursive representation of $\tilde{A}_m$ by mappings $A_m$, the values of which are calculated with a "from left to right" run through a trellis diagram.
  Reversal of the recursion by mappings $B_m$, the values of which are calculated with a "from right to left" run through a trellis diagram.
  joint calculation of all $A_\alpha^i$ by way of a further run through a trellis diagram by using $A_m$ and $B_m$.

The trellis diagram is here a set $$\mathcal{T} = \{(s,q); s \epsilon S, q=0, \ldots, Q+1\} \qquad (42)$$

The elements (s,q) of this set are also called the nodes in the trellis diagram, s representing a state and q being considered as a dynamic value (especially time).

General Recursive Representation

Firstly, some definitions are needed for representing the $A^{\alpha i}$ in a generalized form which allows later transformation. For this reason, the following is determined $$s_i^u := T(s_0, u_1), \, u \epsilon V^m = V \times \ldots \times V, \, m \geq 1, \qquad (43)$$

$$s_j^u := T(s_{j-1}^u, u_j) \, u \epsilon V^m, \, m \geq j > 2, \qquad (44)$$

i.e., $s_j^u$ represents the state of the shift register after j shifts of the register with the input symbols $u_1, \ldots, u_j$.

Furthermore, sets $V_j \subseteq V, j \epsilon N$, which contain the permissible state transition symbols in the j-th step, are considered. Furthermore, product sets are defined as $$U_m : V_1 \times \ldots \times V_m \subseteq V^m, \, m \epsilon \mathbf{N} \qquad (45)$$

i.e., $U_m$ contains the first m components of the permissible input words.

For $q \epsilon N$, mappings $$\mu_q : S \to \mathbf{R} \qquad (46)$$

are considered and for $m \epsilon N$ and input word sets $U_m \subseteq V^m$, mappings are defined as follows $$\tilde{A}_m : \wp(S) \to \mathbf{R}, \qquad (47)$$

$$E \mapsto \sum_{\substack{(u \epsilon U_m) \\ \wedge (s_m^u \epsilon E)}} \prod_{j=1}^{m} \mu_j(s_j^u), \qquad (48)$$

i.e., summing over all permissible input words, the shift register of which reaches a final state in E, is performed. If there are no such input words, the sum is determined as 0 over an empty index set.

In addition, a mapping is determined as $$W : S \times \wp(V) \to \wp(S), \qquad (49)$$

$$(t, \hat{V}) \mapsto \{s \epsilon S; \exists \hat{v} \epsilon \hat{V} \ni T(s, \hat{v}) = t\}, \qquad (50)$$

i.e., W maps $(t, \hat{V})$ into the sets of all states which can reach the state t with a transition symbol from $\hat{V}$.

The following holds true for $m \geq 2$, $E \subseteq S$ $$\tilde{A}_m(E) = \sum_{\substack{(u \epsilon U_m) \\ \wedge (s_m^u \epsilon E)}} \prod_{j=1}^{m} \mu_j(s_j^u) \qquad (51)$$

$$= \sum_{s \epsilon E} \sum_{\substack{(u \epsilon U_m) \\ \wedge (s_m^u = s)}} \prod_{j=1}^{m} \mu_j(s_j^u)$$

$$= \sum_{s \epsilon E} \mu_m(s) \sum_{\substack{(u \epsilon U_m) \\ \wedge (s_m^u = s)}} \prod_{j=1}^{m-1} \mu_j(s_j^u)$$

$$= \sum_{s \epsilon E} \mu_m(s) \sum_{\substack{(u \epsilon U_{m-1}) \\ \wedge (s_{m-1}^u \epsilon W(s, V_m))}} \prod_{j=1}^{m-1} \mu_j(s_j^u)$$

$$= \sum_{s \epsilon E} \mu_m(s) \tilde{A}_{m-1}(W(s, V_m)).$$

In the transformation in the last step but one, attention must be paid to the fact that there is exactly one transition symbol $v \in V_m$ with $T(s_{m-1}^u,v)=s$, if $s_{m-1}^u$ is in $W(s,V_m)$, i.e., it is not necessary to take account of any multiplicities.

Consider, then, the following for $m \geq 2$ mappings $$A_m: S \to \mathbf{R}, \qquad (52)$$

$$s \mapsto \mu_m(s)\tilde{A}_{m-1}(W(s,V^m)). \qquad (53)$$

Thus, a recursion formula can be derived for $m \geq 3$:

$$\begin{aligned}A_m(s) &= \mu_m(s)\tilde{A}_{m-1}(W(s,V_m)) \\ &= \mu_m(s)\sum_{t \in W(s,V_m)} \mu_{m-1}(t)\tilde{A}_{m-2}(W(t,V_{m-1})) \\ &= \mu_m(s)\sum_{t \in W(s,V_m)} A_{m-1}(t).\end{aligned} \qquad (54)$$

Furthermore:

$$\begin{aligned}A_2(s) &= \mu_2(s)\tilde{A}_1(W(s,V_2)) \\ &= \mu_2(s)\sum_{\substack{(u \in U_1) \\ \wedge (s_1^u \in W(s,V_2))}} \mu_1(s_1^u) \\ &= \mu_2(s)\sum_{t \in W(s,V_2)} \mu_1(t)\delta_{s_0} \in W(t,V_1) \\ &= \mu_2(s)\sum_{t \in W(s,V_2)} \mu_1(t)\underbrace{\sum_{\hat{t} \in W(t,V_1)} \underbrace{\delta_{\hat{t}=s_0}}_{=:A_0(\hat{t})}}_{=:A_1(t)}\end{aligned} \qquad (55)$$

In summary, the following thus holds true for $s \in S$, $E \subseteq S$:

$$A_0(s) = \begin{cases} 1, & \text{for } s = s_0, \\ 0, & \text{otherwise} \end{cases} \qquad (56)$$

$$A_m(s) = \mu_m(s)\sum_{t \in W(s,V_m)} A_{m-1}(t), \text{ for } m \in \mathbb{N}, \qquad (57)$$

$$\tilde{A}_m(E) = \sum_{s \in E} A_m(s), \text{ for } m \in \mathbb{N}. \qquad (58)$$

The sets $W(s,V_m)$ can be represented constructively. For this purpose, two further mappings are considered. The following is defined $$\tau: S \to V, \qquad (59)$$

$$s = (s^i, \ldots, s^L)^\tau \mapsto (s^{L-b+1}, \ldots, s^L)^\tau, \qquad (60)$$

i.e., if the state s is the result of a state transition, then $\tau(s)$ was the associated state transition symbol.

Furthermore $$\hat{T}: V \times S \to S, \qquad (61)$$

$$(v,s) \mapsto (v^1, \ldots, v^b, s^1, \ldots, s^{L-b})^\tau, \qquad (62)$$

is defined, i.e., $\hat{T}$ reverses the direction of the shift register operation.

The following then holds $$T(\hat{T}(v,s),\tau(s))=s, \text{ for all } s \in S, v \in V \qquad (63)$$

and for all $t \in S$ and $\hat{V} \subseteq V$, it also holds true that $$\begin{aligned}W(t,\hat{V}) &= \{s \in S; \exists \hat{v} \in \hat{V} \ni T(s,\hat{v}) = t\} \\ &= \begin{cases} \{\hat{T}(v,t); v \in V\}, & \text{if } \tau(t) \in \hat{V}, \\ \emptyset, & \text{else.} \end{cases}\end{aligned} \qquad (64)$$

Thus, the recursion formula (57) for $A_m(s)$ can be written down constructively as follows:

$$\begin{aligned}A_m(s) &= \mu_m(s)\sum_{t \in W(s,V_m)} A_{m-1}(t) \\ &= \begin{cases} \mu_m(s)\sum_{v \in V} A_{m-1}(\hat{T}(v,s)), & \text{if } \tau(s) \in V_m, \\ 0, & \text{else.} \end{cases}\end{aligned} \qquad (65)$$

It should be noted that in this section, no restrictions were set for the set V of the state transition symbols and for the sets $V_j \in \delta(V)$.

Reversal of Recursion

In the text which follows, a recursion in the "reverse direction" compared with the above recursion is described. This new recursion is defined with the aid of the recursion formula (57) for $A_m(s)$.

The following is assumed for this purpose $$T(t,\hat{V}):=\{T(t,\hat{v}); \hat{v} \in \hat{V}\}, \text{ for } t \in S, \hat{V} \subseteq V \qquad (66)$$

and for $M \in \mathbb{N}$, $0 \leq m \leq Q$, the following mappings are considered $$B_m: S \to \mathbf{R}, \qquad (67)$$

with the following recursive characteristic:

$$\begin{aligned}\sum_{s \in S} A_m(s) \sum_{t \in T(s,V_{m+1})} B_{Q-m}(t) &= \sum_{s \in S} \mu_m(s) \sum_{\hat{t} \in W(s,V_m)} A_{m-1}(\hat{t}) \sum_{t \in T(s,V_{m+1})} B_{Q-m}(t) \\ &= \sum_{\hat{t} \in S} \sum_{s \in T(\hat{t},V_m)} \mu_m(s) A_{m-1}(\hat{t}) \sum_{t \in T(s,V_{m+1})} B_{Q-m}(t) \\ &= \sum_{\hat{t} \in S} A_{m-1}(\hat{t}) \underbrace{\sum_{s \in T(\hat{t},V_m)} \mu_m(s) \sum_{t \in T(s,V_{m+1})} B_{Q-m}(t)}_{=:B_{Q-m+1}(\hat{t})},\end{aligned}$$

i.e.,

-continued $$\sum_{s \in S} A_m(s) \sum_{t \in T(s, V_{m+1})} B_{Q-m}(t) = \sum_{s \in S} A_{m-1}(s) \sum_{t \in T(s, V_m)} B_{Q-m+1}(t). \quad (68)$$

By applying equation (68) several times, the following is obtained for an arbitrary $j \in \{1, \ldots, m+1\}$ $$\sum_{s \in S} A_m(s) \sum_{t \in T(s, V_{m+1})} B_{Q-m}(t) = \sum_{s \in S} A_{j-1}(s) \sum_{t \in T(s, V_j)} B_{Q-j+1}(t). \quad (69)$$

According to the above definition, the recursion formula is thus $$B_m(s) = \mu_{Q-m+1}(s) \sum_{t \in T(s, V_{Q-m+2})} B_{m-1}(t), \text{ for } 1 \leq m \leq Q. \quad (70)$$

To terminate the recursion, the following are defined $$B_0(s) = \begin{cases} 1, & \text{for } s = s_0, \\ 0, & \text{else.} \end{cases} \quad (71)$$

Given this termination and the equations (58) and (69), $\tilde{A}_Q(W(s_0, V_{Q+1}))$ can be represented for $V_{Q+1} := \{v_0\}$ and with an arbitrary $j \in \{1, \ldots, Q+1\}$ as follows:

$$\tilde{A}_Q(W(s_0, V_{Q+1})) = \sum_{s \in W(s_0, V_{Q+1})} A_Q(s) \quad (72)$$

$$= \sum_{s \in S} A_Q(s) \sum_{t \in T(s, \{v_0\})} B_0(t)$$

$$= \sum_{s \in S} A_Q(s) \sum_{t \in T(s, V_{Q+1})} B_0(t)$$

$$= \sum_{s \in S} A_{j-1}(s) \sum_{t \in T(s, V_j)} B_{Q-j+1}(t).$$

Note: in the evaluation of (72), $V_j$ is not included in the calculation of the $A_m$ and $B_m$ needed.

Calculation of $A_\alpha^i$

Using the preliminary work from the preceding sections, $A_\alpha^i$ can now be calculated in a simple manner.

For this purpose, the following are defined:

$$V_j := V, \text{ for } j \in \{1, \ldots, \alpha\}, \quad (73)$$

$$V_j := \{v_0\}, \text{ for } j \in \{\alpha+1, \ldots, Q+1\}, \quad (74)$$

i.e., all permissible code words are defined via the states $s_j^u$ with $u \in U_Q = V_1 \times \ldots \times V_Q$ The code words used in the calculation of the $A_\alpha^i$ are restricted by $u_i = \alpha$. For an arbitrary but fixed choice of $i \in \{1, \ldots, K\}$, there is exactly one $j \in \{1, \ldots, \alpha\}$ and exactly one $\hat{\imath} \in \{1, \ldots, b\}$ with $$i = (j-1) \cdot b + \hat{\imath}. \quad (75)$$

Furthermore, the following are defined for an arbitrary but fixed choice of $\alpha \in \{\pm 1\}$:

$$V_j^i(\alpha) := \{v \in V; v_i = \alpha\} \quad (76)$$

$$U_Q^i(\alpha) := V_1 \times \ldots \times V_{j-1} \times V_j^i(\alpha) \times V_{j+1} \times \ldots \times V_Q \subset U_Q, \quad (77)$$

i.e., the code words from $\Gamma^i(\alpha)$ are determined via the states $s_j^u$ with $u \in U_Q^i(\alpha)$.

For an arbitrary, but fixed choice of $y \in R^N$, define for $q \in \{1, \ldots, Q\}$ $$\mu_q : S \to R \quad (78)$$

$$s \mapsto \exp\left(-\frac{1}{2\sigma^2} \sum_{j=1}^n (y_{n(q-1)+j} - C_j(s))^2\right) = \quad (79)$$

$$\exp\left(-\frac{1}{2\sigma^2} \Delta F_q(s)\right).$$

According to the definition of the convolutional code, the following holds true for all $s_Q^u$ with $u \in U_Q$:

$$s_{Q+1}^u = T(s_Q^u, u_{Q+1}) = s_0, \, u_{Q+1} \in V_{Q+1} = \{v_0\}, \quad (80)$$

i.e., $$s_Q^u \in W(s_0, V_{Q+1}). \quad (81)$$

Taking account of equation (72), the following thus holds true:

$$A_\alpha^i(y) = \sum_{c \in \Gamma^i(\alpha)} \prod_{q=1}^Q \exp\left(-\frac{1}{2\sigma^2} \Delta F_q(\tilde{s}_q^c)\right) \quad (82)$$

$$= \sum_{u \in U_Q^i(\alpha)} \prod_{q=1}^Q \mu_q(s_q^u)$$

$$= \sum_{\substack{(u \in U_Q^i(\alpha)) \\ \wedge (s_Q^u \in W(s_0, V_{Q+1}))}} \prod_{q=1}^Q \mu_q(s_q^u)$$

$$= \tilde{A}_Q(W(s_0, V_{Q+1}))$$

$$= \sum_{s \in S} A_{j-1}(s) \sum_{t \in T(s, V_j^i(\alpha))} B_{Q-j+1}(t)$$

The important factor is that the $A_m$ and $B_m$ needed can be calculated independently of $i$ and $\alpha$ via $U_Q$ and, respectively, $U_{Q+1}$. Above, $\tilde{A}_Q(W(s_0, V_{Q+1}))$ was formally determined via the auxiliary construct $U_Q^i(\alpha)$ which, however, is no longer needed in the resultant explicit representation.

SUMMARY OF THE PROCEDURE

Define $$V_j := V, \quad \text{for } j \in \{1, \ldots, \alpha\},$$

$$V_j := \{v_0\}, \quad \text{for } j \in \{\alpha+1, \ldots, Q+1\},$$

$$V_j^i(\alpha) := \{v \in V; v_i = \alpha\}, \quad \text{for } i = (j-1) \cdot b + \hat{\imath},$$

$$\hat{\imath} \in \{1, \ldots, b\},$$

$$j \in \{1, \ldots, \alpha\}, \alpha \in \{\pm 1\}.$$

For an arbitrary, but fixed choice of $y \in R^N$, define for $q \in \{1, \ldots, Q\}$ $$\mu_q : S \to R,$$

$$s \longmapsto \exp\left(-\frac{1}{2\sigma^2} \sum_{j=1}^{n} (y_{n(q-1)+j} - C_j(s))^2\right) = \exp\left(-\frac{1}{2\sigma^2} \Delta F_q(s)\right).$$

Calculate $A_m(s)$, for $s \in S$, $m \in \{1, \ldots, a-1\}$, $B_m(s)$, for $s \in S$, $m \in \{1, \ldots, Q\}$, according to the recursion formulae (57) and (70) and starting values $A_0(s)$, $B_0(s)$, specified above, with (56) and (71).

Calculate all $A_\alpha^i$, $i \in \{1, \ldots, L\}$, $\alpha \in \{\pm 1\}$ over $$A_\alpha^i(y) = \sum_{s \in S} A_{j-1}(s) \sum_{t \in T(s, V_j^i(\alpha))} B_{Q-j+1}(t). \quad (83)$$

and determine the soft outputs $$L(U_i|y) = \ln\left(\frac{A_{+1}^i(y)}{A_{-1}^i(y)}\right), i = 1, \ldots, K.$$

Together with the recursion formula from the preceding section, all $A_\alpha^i(y)$ can now be calculated jointly with $O(2^L \cdot Q)$ or, respectively, $O(K)$ operations instead of $O(K2^K)$ operations.

Note that $L = k \cdot b$, $Q = a+k-1$, $K = a \cdot b$, where a is the number of information bits.

The numeric complexity for calculating the soft outputs has thus been reduced from an exponential order to a linear order where a, the number of information bits, is the decisive quantity.

Special Case: Binary State Transition (B=1)

In the important special case of b=1, the set V of state transition symbols only consists of the two elements +1, −1. The GSM codes, for instance, belong to this widespread special case.

Since now i=j and $V_j^i(\alpha) = \{\alpha\}$ in the above description, the procedure is simplified as follows:

Define $V_j := \{\pm 1\}$, for $j \in \{1, \ldots, \alpha\}$, $V_j := \{+1\}$, for $j \in \{\alpha+1, \ldots, Q+1\}$ For an arbitrary, but fixed choice of $y \in R^N$ define for $q \in \{1, \ldots, Q\}$ $$\mu_q : S \to R$$

$$s \longmapsto \exp\left(-\frac{1}{2\sigma^2} \sum_{j=1}^{n} (y_{n(q-1)+j} - C_j(s))^2\right) = \exp\left(-\frac{1}{2\sigma^2} \Delta F_q(s)\right).$$

Calculate $A_m(s)$, for $s \in S$, $m \in \{1, \ldots, \alpha-1\}$, $B_m(s)$, for $s \in S$, $m \in \{1, \ldots, Q\}$, according to the recursion formulae (57) and (70) and starting values $A_0(s)$, $B_0(s)$ with (56) and (71).

Calculate all $A_\alpha^i$, $i \in \{1, \ldots, K\}$, $\alpha \in \{\pm 1\}$ over $$A_\alpha^i(y) = \sum_{s \in S} A_{i-1}(s) B_{Q-i+1}(T(s, \alpha)). \quad (84)$$

and determine the soft outputs $$L(U_i|y) = \ln\left(\frac{A_{+1}^i(y)}{A_{-1}^i(y)}\right), i = 1, \ldots, K.$$

Algorithmic Conversion

For the algorithmic conversion, consider the trellis diagram $\mathcal{T} = \{(s,q); s \in S, q=0, \ldots, Q+1\}$ and the mappings node weights in state s of trellis segment q $$\mu : \mathcal{T} \to R,$$

$$(s, q) \longmapsto \exp\left(-\frac{1}{2\sigma^2} \Delta F_q(s)\right)$$

Subtotals 'A' in state s of trellis segment q $A : \mathcal{T} \to R,$ $(s,q) \mapsto A(s,q)$ Subtotals 'B' in state s of trellis segment Q−q+1

$B : \mathcal{T} \to R,$ $(s,q) \mapsto B(s,q)$

The mappings are only evaluated in the meaningful subsets of the definition domain.

FIG. 2 shows an algorithm in pseudocode notation which represents a progression in the trellis diagram, considering all states for the calculation of the node weights. The algorithm illustrates the above statements and is comprehensible out of itself. Since the value of $\Delta F_q(s)$ depends only indirectly on the state s and is formed directly with C(s), the following holds true $$|\{\Delta F_q(s); s \in S\}| \leq \min\{2^L, 2^n\},$$

i.e., for n<L, many of the above μ(s,q) have the same value. Depending on the special code, μ(s,q) can thus be determined with far fewer operations in the implementation.

FIG. 3 and FIG. 4 each show an algorithm in pseudocode notation for determining soft outputs. FIG. 3 relates to the general case and FIG. 4 relates to the special case for the binary state transition (b=1). Both algorithms illustrate the above statements and are comprehensible in and of themselves.

With a suitable implementation representation of V and, respectively, $v_j^i(\alpha)$, for instance as subsets of N, the above iterations v∈V and s∈S can be implemented as normal program loops. Naturally, indices which may occur such as, for example, k−1+q, are calculated only once in the implementation and not with every occurrence as is written down here for better clarity.

FIG. 5 shows a processor unit PRZE. The processor unit PRZE comprises a processor CPU, a memory SPE and an input/output interface IOS which is used in various ways via an interface IFC: an output can be displayed on a monitor MON and/or output on a printer PRT via a graphics interface. An input is made via a mouse MAS or a keyboard TAST. The processor unit PRZE also has a data bus BUS which ensures the connection of a memory MEM, the processor CPU and the input/output interface IOS. Furthermore, additional components, for example an additional memory, data store (hard disk) or scanner, can be connected to the data bus BUS.

The above-described method and apparatus are illustrative of the principles of the present invention. Numerous modifications and adaptations will be readily apparent to those skilled in this art without departing from the spirit and scope of the present invention.

What is claimed is:

1. A method for decoding a predetermined code word, wherein said code word comprises a number of positions having different values, comprising the steps of:

providing a processor comprising a central processing unit, memory, an input/output interface, and a data bus connecting said central processing unit to said memory and said input/output interface, said processor decoding a predetermined code word;

determining a calculation rule for a soft-output value for each position of said code word, each said position of said code being correlated with said soft-output value, according to the formula $$L(U_i|y) = \ln\left(\frac{\sum_{c \in \Gamma^i(+1)} \exp\left(-\frac{(y-c)^T(y-c)}{2\sigma^2}\right)}{\sum_{c \in \Gamma^i(-1)} \exp\left(-\frac{(y-c)^T(y-c)}{2\sigma^2}\right)}\right), \text{ for } i = 1, \ldots, K,$$

where $L(U_i|y)$ is a safety measure (soft output) for the i-th position of the code word to be determined;

y is a demodulation result to be decoded;

c is a code word;

$\Gamma^i(\pm 1)$ are all code words for $u_i \pm 1$; and $\sigma^2$ is a variance (channel disturbance);

utilizing a characteristic of a convolutional code, in decoding of said code word, for determining said correlation of said individual positions of said code word from which steps follow of determining states in accordance with a shift register operation, and obtaining a trellis representation from these states;

calculating weights $\mu_q q(s)$, for an arbitrary choice of $y \in R^N$, for nodes (s,q) of said trellis representation by evaluating $$\mu_q : S \to \mathbf{R},$$

$$s \longmapsto \exp\left(-\frac{1}{2\sigma^2} \sum_{j=1}^{n} (y_{n(q-1)+j} - C_j(s))^2\right)$$

for $q \in \{1, \ldots, Q\}$;

determining mappings $A_m$ by way of said trellis representation, running through said trellis representation in the natural direction, and calculating the term $A_m$ by $$A_m(s) = \mu_m(s) \sum_{t \in W(s,V_m)} A_{m-1}(t), \text{ for } m \in \mathbb{N}$$

and a starting value $$A_0(s) = \begin{cases} 1 & : \text{ for } s = s_0, \\ 0 & : \text{ else} \end{cases}$$

determining mappings $B_m$ by way of said trellis representation, said trellis representation being run through in opposition to a predetermined direction, and calculating the term $B_m$ by $$B_m(s) = \mu_{Q-m+1}(s) \sum_{t \in T(s,V_{Q-m+2})} B_{m-1}(t), \text{ for } 1 \leq m \leq Q,$$

where $$B_0(s) = \begin{cases} 1 & : \text{ for } s = s_0, \\ 0 & : \text{ else} \end{cases}$$

is determined for terminating the recursion; and determining terms $A_\alpha^i$ by again running through said trellis representation taking into consideration said terms $A_m$ and $B_m$ already determined, according to a relation $$A_\alpha^i(y) = \sum_{s \in S} A_{i-1}(s) \sum_{t \in T(s,V_j^i(\alpha))} B_{Q-j+1}(t),$$

where $$j = \left\lfloor \frac{i-1}{b} \right\rfloor + 1;$$

determining K positions of said code word according to $$L(U_i|y) = \ln\left(\frac{A^i_{+1}(y)}{A^i_{-1}(y)}\right), i = 1, \ldots, K.$$

2. The method as claimed in claim 1, wherein said convolutional code has binary state transitions, said method further comprising the steps of:

determining mappings $A_m$ recursively by the equation $$A_m(s) = \mu_m(s)(A_{m-1}(\hat{T}(+1,s)) + A_{m-1}(\hat{T}(-1, s))), \text{ for } m \in \mathbf{N};$$

determining mappings $B_m$ recursively by the equation $$B_m(s) = \mu_{Q-m+1}(s)(B_{m-1}(T(s,+1)) + B_{m-1}(T(s,-1))),$$

for $1 \leq m \leq Q$; and determining terms $A_\alpha^i$, $i \in \{1, \ldots, K\}$, $\alpha \in \{\pm 1\}$ according to the equation $$A_\alpha^i(y) = \sum_{s \in S} A_{i-1}(s) B_{Q-i+1}(T(s, \alpha)).$$

3. The method as claimed in claim 1, further comprising the step of:

providing a mobile radio network in which said decoding of a predetermined code word operates.

4. The method as claimed in claim 3, wherein said mobile radio network is a GSM network.

5. The method as claimed in claim 1, wherein said predetermined code word is a concatenated code word, said method further comprising the steps of:

providing said calculated soft-output values as input data of another decoder.

* * * * *